United States Patent [19]

Thompson et al.

[11] 4,345,201
[45] Aug. 17, 1982

[54] FAULT LOCATION SYSTEM WITH ENHANCED NOISE IMMUNITY

[75] Inventors: Brett A. Thompson, Poole; John A. Webb, Ferndown; Martin B. White, Sopley, all of England

[73] Assignee: Membrain Limited, Dorset, England

[21] Appl. No.: 161,484

[22] Filed: Jun. 20, 1980

[30] Foreign Application Priority Data

Dec. 20, 1979 [GB] United Kingdom ............... 7943989

[51] Int. Cl.³ .................... G01R 31/08; G01R 31/28
[52] U.S. Cl. .............................. 324/52; 324/73 PC; 324/149
[58] Field of Search ......... 324/52, 67, 73 AT, 73 PC, 324/133, 149

[56] References Cited

U.S. PATENT DOCUMENTS

| 4,074,188 | 2/1978 | Boatman et al. | 324/52 |
| 4,115,731 | 9/1978 | Axtell | 324/52 |
| 4,186,338 | 1/1980 | Fichtenbaum | 324/52 |

FOREIGN PATENT DOCUMENTS 2443716  3/1976  Fed. Rep. of Germany ........ 324/52

OTHER PUBLICATIONS

Beckwith et al., "Tracing Current by Inductive Pickup Tracks Logic Faults Precisely", Electronics, vol. 49, No. 25, pp. 106-110, Nov. 25, 1976.
Weston Instruments Model 670 "In-Circuit Tester", (operation manual).
J. F. Beckwith, Current Tracer: *A New Way to Find Low Impedance Logic-Circuit Faults*, brochure of Hewlett Packard, pp. 2-8.
M. Hoffman and J. Wrinn, *A Technique for Precise Fault Diagnosis on Device-Laden Buses of LSI Boards*, Teradyne, Inc., pp. 371-376.

*Primary Examiner*—Gerard R. Strecker
*Attorney, Agent, or Firm*—Dale Gaudier

[57] ABSTRACT

A probe for sensing the direction of flow of an injected current pulse along a conductor of a circuit under test. The probe is linked to automatic test equipment (ATE), and is triggered to inject the pulse during a test sequence at a step previously found by the ATE to establish a faulty state in the circuit so that the faulty one of several components connected to a circuit node can be identified. The probe injects an approximately triangular-waveform current pulse which has a steep rising edge and a less steep falling edge, thereby inducing a voltage level and thus permits discrimination of the direction of current flow. To detect low level current pulses in the presence of masking noise, the output of the probe is connected to the series combination of a filter, an integrator and an A/D converter. The circuit under test is set to its faulty state, and then the probe is repeatedly operated, first with the injection of the current pulses inhibited and then with current pulses being injected. An average noise level is calculated, and then compared with the average signal level obtained while pulses are being injected to determine the direction of flow of the injected current pulses.

9 Claims, 5 Drawing Figures

FAULT LOCATION SYSTEM WITH ENHANCED NOISE IMMUNITY

This invention relates to methods and apparatus for locating faults in powered electronic circuits.

In co-pending United Kingdom Patent Application No. 79 21940, corresponding to United States Patent Application Ser. No. 161,485 filed simultaneously herewith and assigned to the same assignee as the present application, there are described and claimed such a method and apparatus, in which a pulse of current of predetermined sense and having an approximately triangular waveform with a relatively steep leading edge and a relatively less steep trailing edge is applied to a conductor of the circuit, and the magnetic field changes induced adjacent to said conductor by the leading edge of the pulse is sensed by a suitable sensing probe to determine the direction of flow of the current along the conductor. This method and apparatus has proved extremely satisfactory for locating faults in many different kinds of electronic circuits, including those incorporating many large scale integrated (LSI) logic circuits. However, we have found that certain kinds of electronic circuits, particularly logic circuits involving high frequency clock pulses and/or certain kinds of random access memory (RAM) having internally-generated power supply voltages, produce noise currents whose effects tend to mask the magnetic field changes induced by the applied current pulse, even when the circuit is held in its faulty state. It is an object of the present invention to alleviate this problem.

According to one aspect of the present invention, there is provided a method of locating a fault in a powered electronic circuit, the method comprising:
(a) setting said circuit to a state in which the fault is apparent;
(b) locating the circuit node at which said fault originates;
(c) repeatedly applying to a conductor of said circuit at said node pulses of current of the same predetermined sense, each pulse having an approximately triangular waveform with a relatively steep leading edge and a relatively less steep trailing edge;
(d) sensing magnetic field changes induced adjacent to said conductor by the leading edge of each said pulse, so as to produce respective first signals representative of said pulse-induced changes;
(e) integrating a predetermined number of said first signals to produce a signal representative of the average value thereof;
(f) sensing magnetic field changes induced adjacent to said conductor, in the absence of said applied pulses, by noise currents in said circuit, so as to produce further signals representative of said noise-induced changes;
(g) integrating a predetermined number of said further signals to produce a signal representative of the average value thereof; and
(h) producing, in response to the magnitude and polarity of the difference between the respective average values of the first and second signals, a signal indicative of the direction of flow of said current pulses along said conductor, whereby to permit the determination of the direction of said fault relative to the point on said conductor at which said pulses are applied.

Conveniently, steps (f) and (g) are effected before steps (c), (d) and (e).

According to another aspect of the invention, there is provided apparatus for locating a fault in a powered electronic circuit, the apparatus comprising:
means arranged repetitively to apply to a conductor of said circuit pulses of current of predetermined sense and each having an approximately triangular waveform with a relatively steep leading edge and a relatively less steep trailing edge;
means arranged to sense magnetic field changes induced adjacent to said conductor by the leading edge of each said pulse and by noise currents in said circuit, so as to produce signals representative of said pulse- and noise-induced changes;
integrating means arranged to receive and integrate first and second pluralities of said change-representative signals to produce respective signals representative of the respective average values of said first and second pluralities of said change-representative signals, one of said first and second pluralities of signals being produced in response both to said pulses and to said noise, and the other being produced in response only to said noise; and
means responsive to the magnitude and polarity of the difference between the two average-representative signals to produce a signal indicative of the direction of flow of said current pulses along said conductor, whereby to permit the determination of the direction of said fault relative to the point on said conductor at which said pulses are applied.

The invention will now be described, by way of example only, with reference to the accompanying drawings, of which:

The apparatus to be described is intended for use in fault location on assembled printed circuit boards. In conventional testing of such a board carrying, for example, a complex digital logic circuit, power is supplied to the circuit via an edge connector on the board, and test signals are then applied in a predetermined sequence to the circuit so that it adopts various different logical states. For each such state, electrical voltages at various points in the circuit are sensed and their logic values (or combinations thereof) are compared with predetermined values (or combinations thereof) that would be expected during normal, fault-free operation of the circuit. Any departure from these expected values indicates a fault in the circuit.

Typically, the fault may be a short-circuit (or a component failure whose effect is similar to a short-circuit) between the point, such as a printed circuit conductive track, where the incorrect voltage is observed and either the power supply rail or the power return rail of the circuit. If the point is a circuit node, to which several different components are coupled, simple measurement of the node voltage does not permit the faulty component to be identified. However, injection of a test pulse of current into the node can resolve this difficulty.

Figure 1:
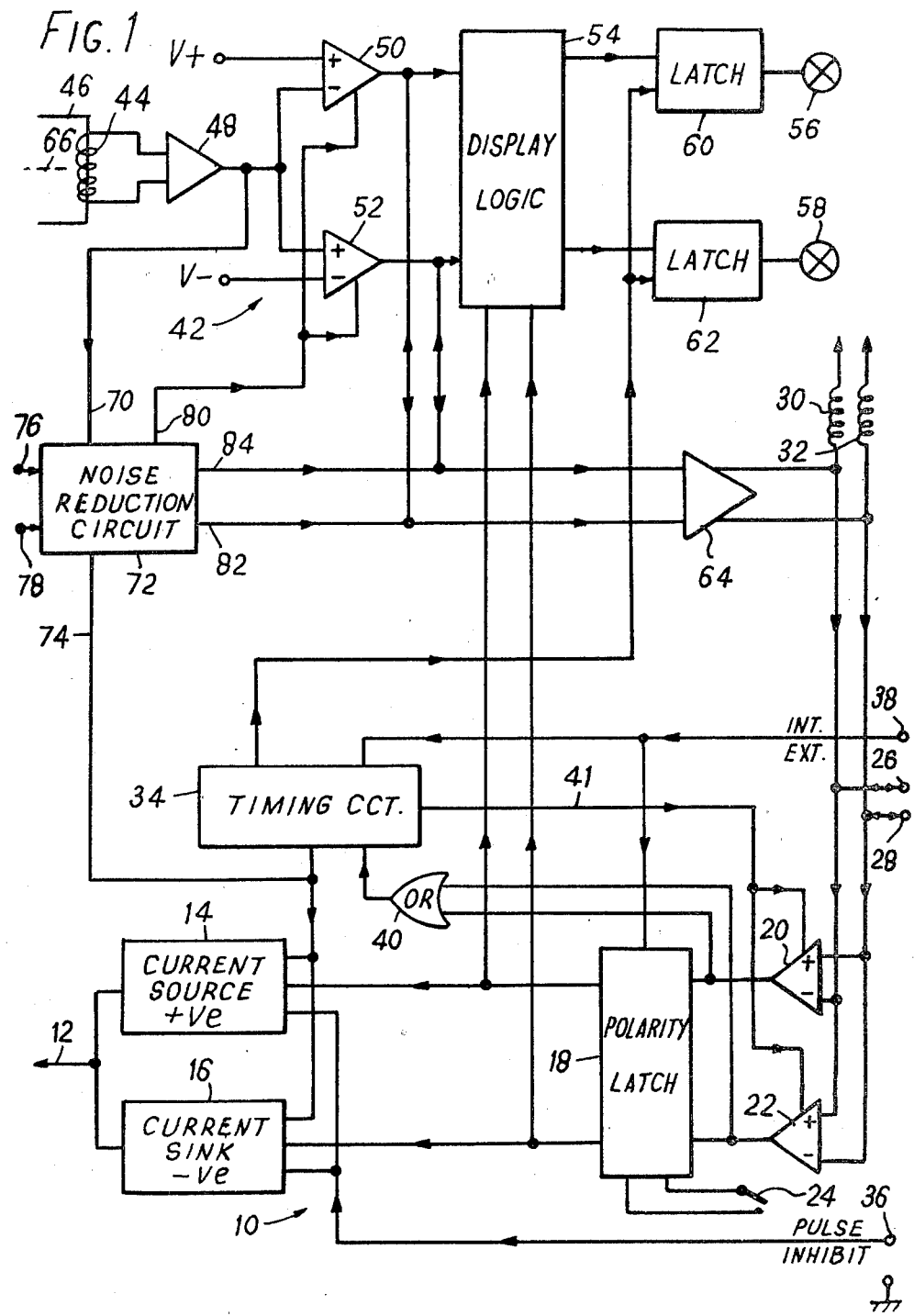
FIG. 1 is a block schematic circuit diagram of fault locating apparatus in accordance with the present invention.

Accordingly, and as shown in FIG. 1, the apparatus includes a current supply circuit 10, which has a current injection probe 12 coupled to a current source 14 and a current sink 16. For testing a circuit in which the power supply rail is, as is usual, positive with respect to the power return rail, the current source 14 is arranged to supply positive-going current pulses and the current sink 16 is arranged to supply negative-going current pulses. Selection of either the current source 14 or the current sink 16 is controlled by a polarity latch 18 in response either to the signals from two comparators 20 and 22 or to a manually-operable switch 24. The comparators 20 and 22 are coupled, inversely relative to one another, to two input/output terminals 26 and 28. These two terminals 26 and 28 also constitute the power supply terminals of the apparatus, the d.c. power being separated from input and output signals by two chokes 30 and 32 for supply to the various parts of the apparatus along appropriate conductors (omitted for clarity).

Operation of the current source 14 or the current sink 16 is triggered by a timing circuit 34, and can be inhibited by a signal on an input terminal 36.

The timing circuit 34 operates in accordance with a control signal on an input terminal 38 to trigger the respective one of the source 14 and the sink 16 selected by the polarity latch 18, either continuously at approximately 1 kHz (internal operation), or selectively in response to a signal from an OR-gate 40 which has two inputs coupled to respective ones of the comparators 20 and 22 (external operation). The input terminal 38 is also coupled to the polarity latch 18 to control it to respond either to the comparators 20 and 22 (for external operation) or to the switch 24 (for internal operation). Once the timing circuit 34 has triggered one of the source 14 and the sink 16, it temporarily inhibits further operation of the comparators 20, 22 via a control line 41.

The apparatus also has a current sensing circuit 42, in which a coil 44 is wound on the centre portion of a U-shaped (or bifurcated) ferrite core indicated very schematically at 46. The ends of the coil 44 are coupled to a sense amplifier 48 which drives oppositely sensed inputs of two comparators 50 and 52. These comparators also receive opposite polarity reference voltages V+ and V— respectively, and their outputs are coupled to a display logic circuit 54 which also receives the output signals of the polarity latch 18 in the current supply circuit 10.

The output of the amplifier 48 is also connected to an input 70 of a noise reduction circuit. The noise reduction circuit 72 has another input 74 connected to the output of the timing circuit 34 used to trigger the current source 14 and the current sink 16, and two control inputs 76, 78 respectively. The noise reduction circuit 72 also has an output 80 connected to respective inhibit inputs of the comparators 50 and 52, and two further outputs 82, 84 which are wire-OR connected to the respective outputs of the comparators 50 and 52. The construction and operation of the noise reduction circuit will be described hereinafter in more detail with reference to FIG. 5.

The display logic 54 responds to the signals at its inputs to energise an appropriate one of two light-emitting diode direction indicators 56 and 58, via respective latches 60 and 62 which are enabled by the timing circuit 34.

The outputs of the comparators 50 and 52 are also connected to a differential output amplifier 64 which supplies corresponding oppositely-sensed signals to the input/output terminals 26 and 28: these signals are prevented from affecting the polarity latch 18 by the fact that the operation of the comparators 20, 22 is temporarily inhibited as mentioned earlier.

The design of each of the above-mentioned circuits will become apparent to one skilled in the art in the light of the following description, and need not be discussed in detail here.

In use, the circuit under test is energised and set to the state in which a fault is observed, the current injection probe 12 is placed on a printed circuit conductor forming part of the node where the fault is present, and a pulse of current is injected into the conductor. Assuming that the control signal on the terminal 38 is selecting external operation, the injection of the current pulse will be triggered by the timing circuit 34 in response to a pulse on one of the terminals 26 and 28, acting via the appropriate one of the comparators 20 and 22 and the OR-gate 40. At the same time, polarity latch 18 responds to the appropriate comparator to enable either the current source 14 or the current sink 16 in accordance with the polarity of the trigger pulse.

The magnitude of the current pulse is limited to 1 milliampere, which is insufficient to cause any change in the state of the logic circuits of the circuit under test. Typically, for transistor-transistor logic (TTL) circuits, a pulse from the current source 14 will cause a positive-going voltage pulse of approximately 100 mV maximum magnitude, as compared with the maximum 800 mV threshold permitted for a signal to represent a logic 0 input signal (assuming positive logic). Similarly, a pulse from the current sink 16 will cause a negative-going pulse also of approximately 100 mV maximum magnitude from a worst case logic 1 output signal of 2.8 volts, compared with the minimum 2.4 volts which is accepted as a logic 1 input signal.

The ends of the U-shaped ferrite core 46 are simultaneously placed on or just above the printed circuit conductor, so that the magnetic field associated with the pulse of current flowing therethrough can induce a corresponding voltage pulse across the coil 44.

This pulse acts via the amplifier to trigger one or other of the comparators 50 and 52 in accordance with the polarity of the pulse, which will in turn depend on the direction of the magnetic field inducing the pulse. However, the direction to the fault (as distinct from the direction of current flow to or from the fault) is related not only to the polarity of the voltage pulse, but also to the polarity of the test current pulse. Accordingly, the display logic 54 receives a signal both from the triggered comparator 50 or 52 and from the polarity latch 18, and by comparison of these signals supplies a signal to the appropriate one of the indicators 56 and 58 to indicate the direction to the fault. The indication is maintained by means of the latches 60 and 62 which are enabled at an appropriate time after injection of the test current pulse by the timing circuit 34.

In the internal mode of operation, the test current pulses are triggered automatically by the timing circuit 34 at a rate of 1 kHz and with a polarity dependent on the setting of the switch 24.

If the apparatus is being used, in the external mode of operation, in conjunction with an automatic test equipment which supplies the sequence of test signals mentioned earlier, such as the Applicants type MB 2400 series or MB 7700 series automatic test equipment, the test equipment is arranged to conduct the sequence of test steps, so as to identify and store the number of the steps at which the circuit under test enters the faulty state. The test equipment is then caused to repeat the sequence, triggering the apparatus shown in FIG. 1, via the terminals 26 and 28, when the identified step recurs, thus applying the test current pulse while the circuit under test is in the faulty state: circuitry for achieving this triggering will be described hereinafter with reference to FIG. 4. The resulting signal supplied to the automatic test equipment via the amplifier 64 and the terminals 26 and 28 enables the equipment to diagnose the fault or select further test steps as necessary.

Figure 2:
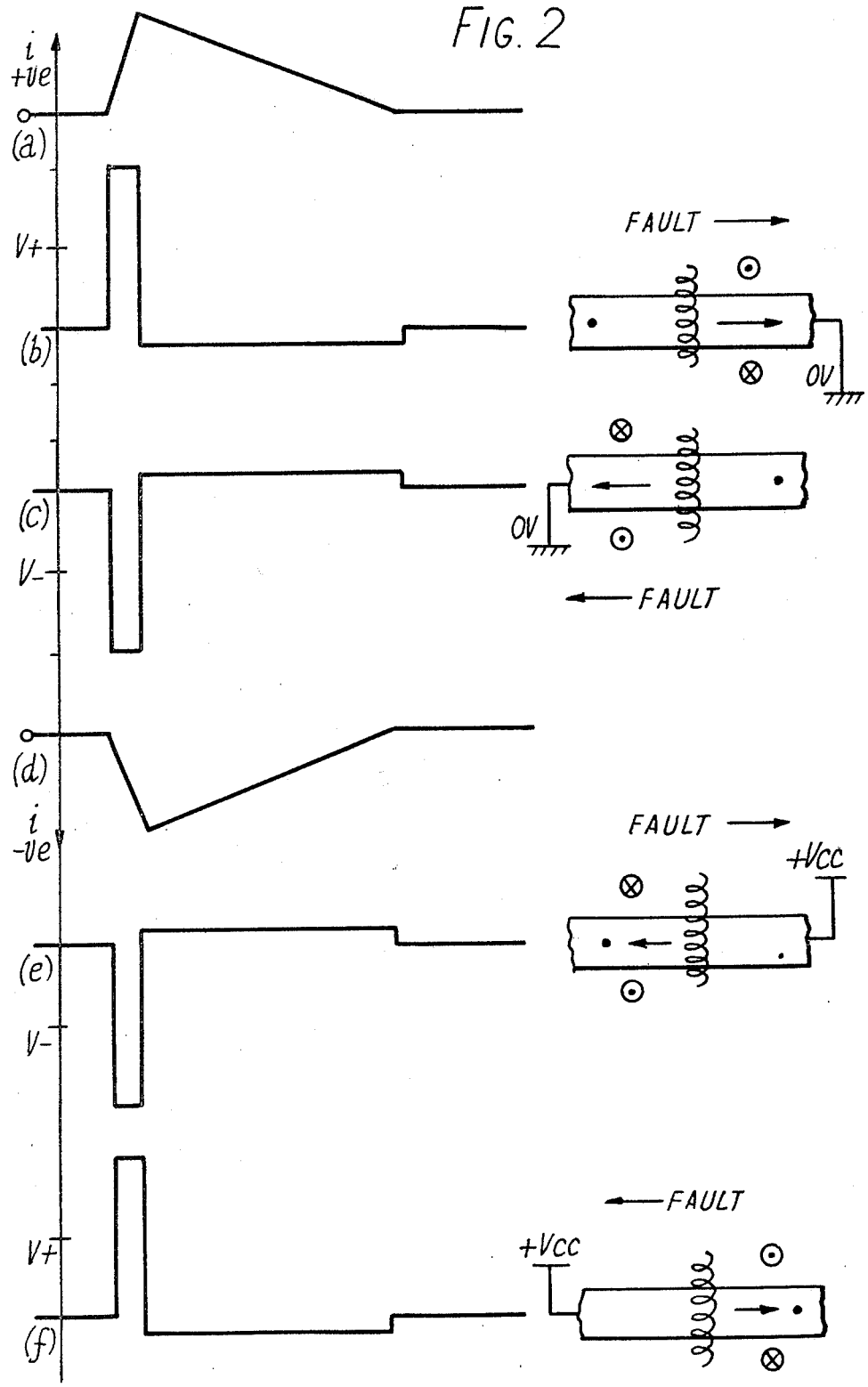
FIG. 2 shows somewhat idealised versions of waveforms appearing in the circuit of FIG. 1.

The current pulses supplied by the circuits 14 and 16 have an approximately triangular waveform, as shown in somewhat idealised form in FIG. 2, in which the leading edge is very steep (typical rise time 10 nanoseconds) and the trailing edge is much less steep (typical fall time 200 nanoseconds). Although the trailing edges of the pulses are shown in FIG. 2 as being substantially linear, they are in practice approximately exponential, since the pulses are typically each shaped by means of a respective simple differentiating circuit of the series capacitance, shunt resistance type disposed within the respective circuit 14 or 16 and arranged to receive a step input signal triggered by the timing circuit 34. As also shown in FIG. 2, the resulting voltage pulse induced in the coil 44 has a short, high-amplitude excursion of one sense followed by a longer but lower-amplitude excursion of the other sense. Thus, appropriate selection of the magnitudes of V+ and V− enables the sense of the first excursion (and thus of the direction of flow of the test current pulse) to be readily distinguished. The voltage pulses induced in the coil 44 are again shown in somewhat idealised form in FIG. 2: in practice, they are shaped by the inductance and stray capacitance of the coil 44 so as to appear as damped sinusoidal pulses, with the first half cycle much greater in amplitude than the second.

FIG. 2 also shows the relationships between direction of current flow, polarity of test current, and fault direction. Thus, referring to FIGS. 2b and 2c, for a positive-going test current pulse, current flow to the right or left indicates (for an appropriate orientation of the ferrite core 46) a fault to the right or left respectively. Conversely, for a negative-going test current (FIGS. 2e and 2f), current flow to the right or left indicates a fault to the left or right respectively. The display logic 54 includes a simple arrangement of gates and latches designed to implement these relationships.

Note that if the ferrite core 46 is rotated axially through 180°, the polarity of the voltage pulse induced in the coil 44 is also reversed, thus interchanging the states of the indicators 56 and 58. However, if these indicators are mounted on the same support as the core 46, on opposite sides of its axis 66, their positions are also interchanged, thus maintaining the correct indication.

Figure 3:
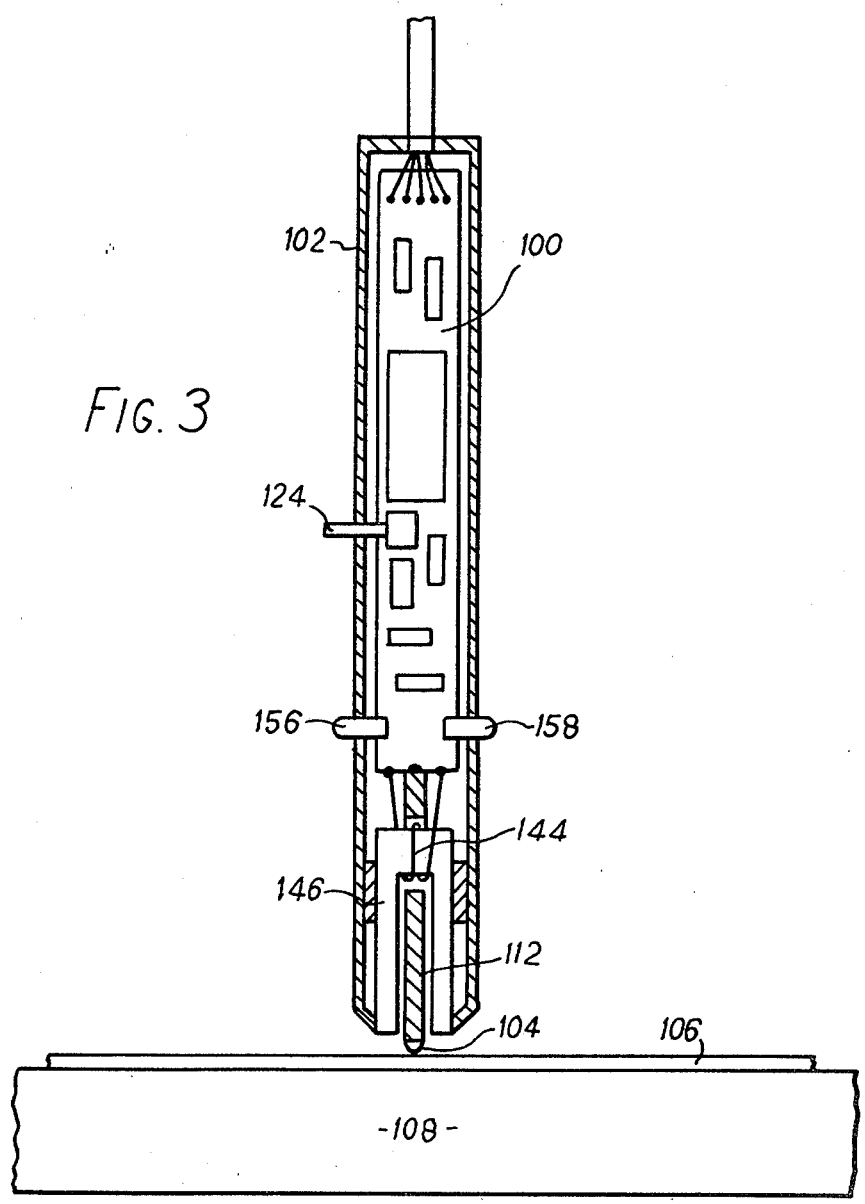
FIG. 3 is a sectional view of one form of probe forming part of the apparatus of FIG. 1.

One form of the apparatus constructed in this manner is shown in FIG. 3, in which parts corresponding to those in FIG. 1 have corresponding reference numerals prefixed by 1.

Referring to FIG. 3, the various parts of the circuit are mounted on an elongate printed circuit board 100 within a tubular housing 102, through the wall of which project the indicators 156 and 158 and the switch 124. The bifurcated ferrite core 146 is mounted at one end of the housing 102, with the current injection probe 112, in the form of a metal plate ending in a point 104, projecting down between the limbs of the core 146: for the sake of clarity, the ferrite core 146 is shown rotated through 90° in FIG. 3, in order to render the current injection probe 112 visible, but in practice the limbs of the core 146 and the probe 112 lie in a common plane perpendicular to the plane of FIG. 3. Thus, the apparatus can be placed with one hand on a conductor 106 of a circuit board 108 under test, whereupon the current injection probe 112 and the ferrite core 146 are simultaneously correctly positioned for the injection of a test current pulse.

Figure 4:
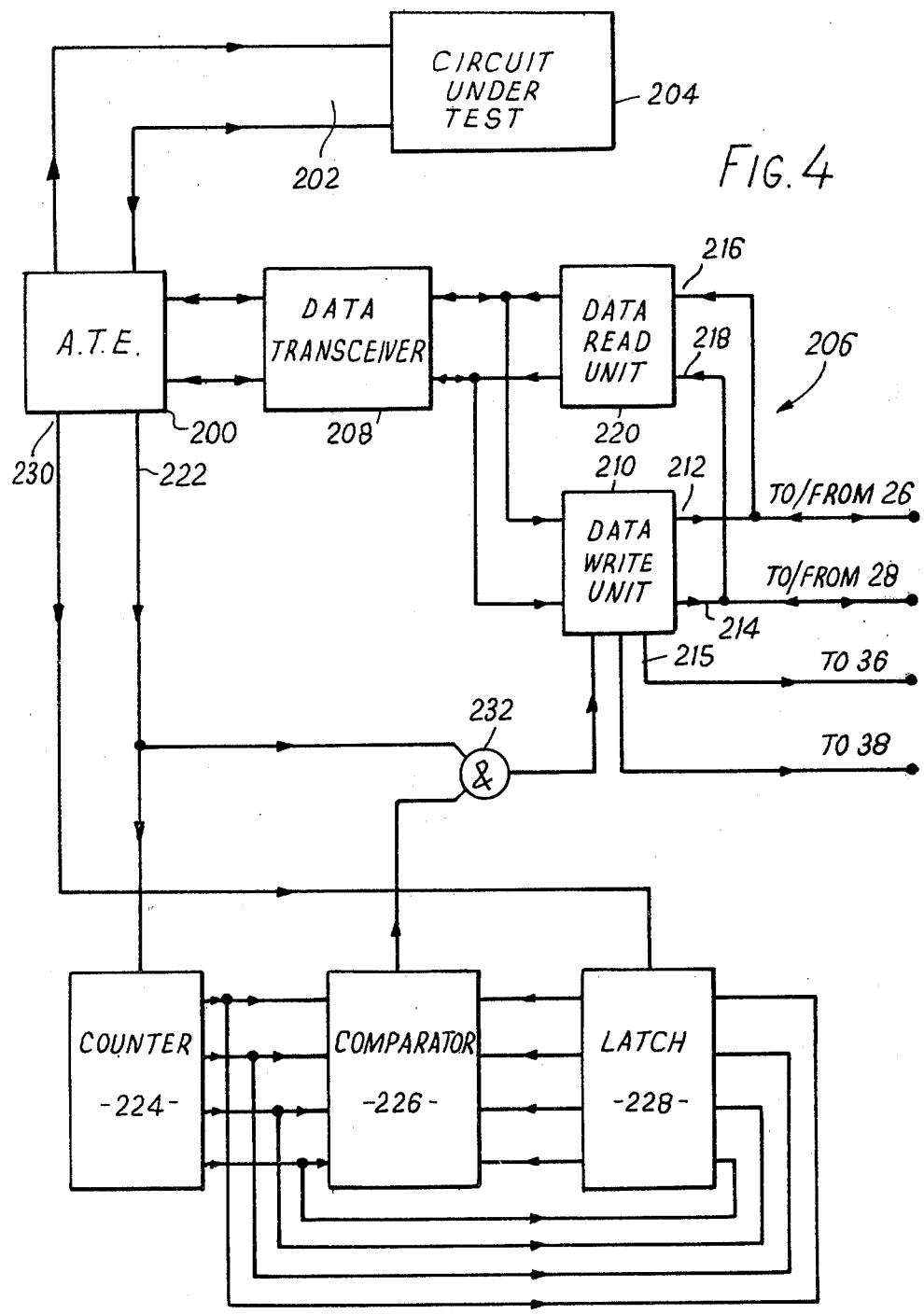
FIG. 4 is a schematic block diagram of automatic test equipment in accordance with the present invention and adapted to incorporate the apparatus of FIGS. 1 and 3.

The automatic test equipment (A.T.E.) of FIG. 4 is indicated generally at 200, and may for example comprise type MB 7700 series A.T.E. as manufactured and sold by the Applicant. The A.T.E. 200 is shown connected via a bus 202 to a complex digital circuit under test, which is indicated at 204 and which may typically comprise a large number of LSI circuits (not shown) mounted on a printed circuit board (not shown). The board of the circuit 204 is normally mounted in its usual edge connector (not shown), and the bus 202 is connected to this edge connector. As is well known, the A.T.E. 200 is programmed to provide the circuit 204, via the bus 202, with its required power supplies and a sequence of test signals, and to monitor the response of the circuit 204 to these test signals in order to detect any faults which may be present in the circuit.

The A.T.E. 200 is provided with interface circuitry, generally indicated at 206, for interfacing the A.T.E. to the apparatus of FIGS. 1 and 3. The circuitry 206 comprises a data transceiver 208 for receiving data from and transmitting data to the A.T.E. 200 (specifically from and to a central processor therein), the data transceiver 208 being connected to apply data it receives from the A.T.E. 200 to a data write unit 210. The data write unit 210 has three outputs 212, 214, 217, which are respectively connected to the input/output terminals 26, 28 and the input terminal 28 of the apparatus of FIGS. 1 and 3, and a third output 215 connected to the terminal 36 of this apparatus. The terminals 26, 28 are also connected to two inputs 216, 218 of a data read unit 220, whose outputs are commoned with the inputs of the data write unit 210 and connected to the data transceiver 208.

The A.T.E. 200 has an output 222 at which it produces test pulses each synchronised with a respective step of the sequence of test signals being applied to the circuit 204, this output being connected to the count input of a test number counter 224. The count outputs of the counter 24 are connected to a first set of inputs of a comparator 226, and to the inputs of a latch 228, whose outputs are connected to the other set of inputs of the comparator 226.

The A.T.E. 200 has a further output 230 at which it produces a pulse, synchronised with a test pulse, when it detects a fault in the circuit 204. The output 230 is connected to an enabling input of the latch 228.

The output of the comparator 226 is connected to one input of a two-input AND gate 232, whose other input is connected to the output 222 of the A.T.E. 200 and whose output is connected to a further input of the data write unit 210.

In operation, the A.T.E. 200 is set to run through the sequence of test signals for a first time, and as it does so, the count in the counter 224 is incremented by one for each successive step in the sequence: the count in the counter 224 is thus indicative of the number in the sequence of the test signal actually being applied to the circuit 204 at any instant. On this first run through the sequence, operation of the apparatus of FIGS. 1 and 3 is inhibited, if appropriate, by a signal applied by the A.T.E. 200 to its input terminal 36 via the data transceiver 208 and the data write unit 210.

Suppose that on step number 27 of the sequence, the A.T.E. 200 detects a fault in the circuit 204. Besides storing details of the fault for diagnostic purposes, the A.T.E. 200 produces a "fault detected" pulse at its output 230, which pulse is operative to strobe the count in the counter 224, currently 27, into the latch 228: the sequence then continues to its end. Suppose further that an initial diagnosis, based on the known operating characteristics of the circuit 204 and perhaps involving probing the voltages at various points in the circuit, indicates that the fault is associated with a particular circuit conductor or node to which several LSI circuits are connected. The A.T.E. 200 will instruct the operator to place the probe 12/112 of the apparatus of FIGS. 1 and 3 on the node in question, and from preprogrammed information relating to the nature of the circuits connected to the node, will enable the appropriate one of the outputs 212, 214 of the data write unit 210 (corresponding to the appropriate one of the source 14 and sink 16 in the apparatus of FIGS. 1 and 3) by way of the data transceiver 208.

The A.T.E. 200 is then set to run through the sequence of test signals again. When it reaches step 27 of the sequence, ie the step at which the fault appears, the comparator 226 produces an output signal which enables the AND gate 232. The test pulse present on the other input of the AND gate thus triggers the apparatus of FIGS. 1 and 3, via the enabled one of the outputs 212, 214 of the data write unit 210 and the corresponding one of the inputs 26,28, to apply a current pulse to the node in question, with the results described earlier in relation to FIGS. 1 to 3. In particular, the resulting output signal appearing at the terminals 26,28 is transmitted back to the A.T.E. 200 via the data read unit 220 and the data transceiver 208. The operator can repeat this process (which is extremely rapid) several times as he explores different parts of the node, until he has determined the precise location of the fault.

It will be appreciated that this technique is particularly valuable for locating transient faults, since it ensures that the fault locating current pulse is applied at an instant when the fault is known to be present. The current pulse injection technique has the further advantage that the effects of a relatively small current pulse can be detected even in the presence of a larger D.C. current.

As mentioned earlier, certain digital logic circuits, particularly those involving high frequency clock pulses and/or certain kinds of random access memory (RAM) having internally-generated power supply voltages, produce noise currents whose effects are similar to, and thus tend to mask, the magnetic field changes which the probe 12/112 is intended to detect. Once a faulty node has been identified by an initial diagnosis of the kind mentioned hereinbefore, the operator can readily check if the circuit 204 is subject to such noise currents by setting the circuit to its faulty state, placing the probe 12/112 on the faulty node, and triggering several one-shot measurements via the appropriate one of the inputs 26,28 of FIG. 1 while the operation of the current source 14 and the current sink 16 is inhibited via the input 36. If one of the comparators 50 or 52 is triggered during these measurements, as indicated for example by illumination of one of the indicators 56,58, a latch (not shown) provided in the A.T.E. 200 is set to indicate that the noise level at the faulty node is unacceptably high. In this case, the A.T.E. 200 selects a different mode of operation in which the noise reduction circuit 72 effectively replaces the comparators 50 and 52.

Figure 5:
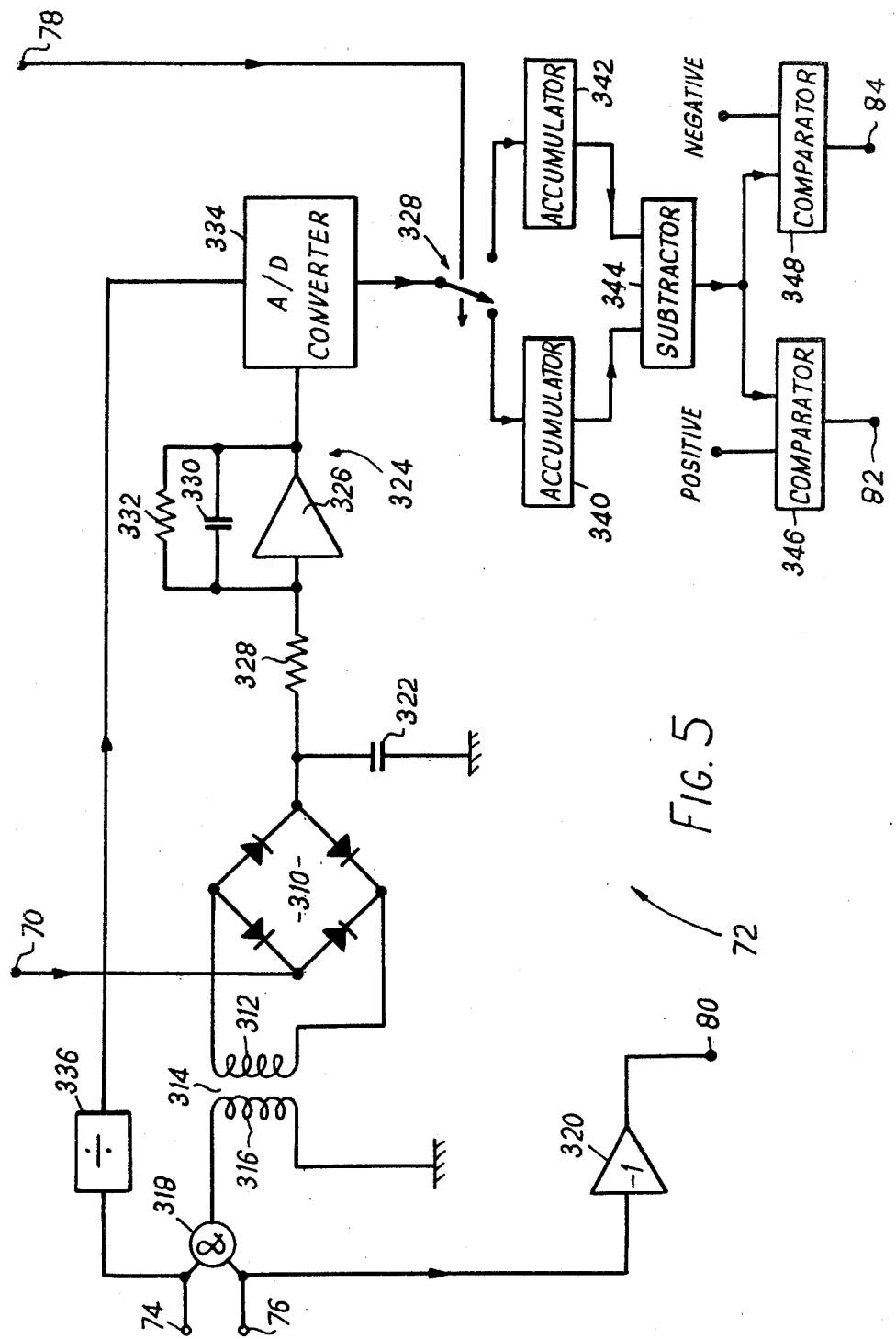
FIG. 5 is a simplified circuit diagram of part of the circuit of FIG. 1.

The noise reduction circuit 72 is shown in more detail in FIG. 5, and comprises a diode bridge switching circuit 310 connected to be rendered conductive by the signal produced by the secondary winding 312 of a pulse transformer 314 connected across one diagonal of the bridge. The primary winding 316 of the transformer 314 is connected to be energised by a pulse applied to the input 74 of the circuit 72 from the timing circuit 34 of FIG. 1. This pulse is applied to the winding 316 via a two-input AND gate 318, one of whose inputs is constituted by the input 74 and the other of whose inputs is constituted by the input 76. The input 76 is connected to receive an enabling signal from the aforementioned "high noise level" latch in the A.T.E. 200 of FIG. 4: an inverted version of this enabling signal, derived by an inverter 320, is applied to the output 80 of the circuit 72 to inhibit the operation of the comparators 50 and 52 of FIG. 1.

The output signals produced by the amplifier 48 of FIG. 1 are applied via the input 70 of the circuit 72 to the input of the other diagonal of the bridge circuit 310, whose output is connected via a filter capacitor 322 to an integrator 324. The integrator 324 comprises a high gain amplifier 326 having an input resistor 328 and the parallel combination of a capacitor 330 and a resistor 332 negative-feedback-connected between its output and its input. The output of the integrator 324 is connected to the input of an analogue-to-digital converter 334, which has an enabling input coupled to the input 74 of the circuit 72 via a frequency divider 336.

The digital output of the converter 334 is routed via a switching circuit 338 (shown for the sake of simplicity in FIG. 5 as a simple change-over switch) to a selected one of two accumulators 340,342. The state of the switching circuit 338 is controlled by the A.T.E. 200 of FIG. 4 as will hereinafter be explained.

The respective outputs of the accumulators 340, 342 are coupled to a digital subtraction circuit 344, whose output is compared with positive and negative thresholds in digital comparators 346 and 348 respectively. The respective outputs of the comparators 346 and 348 constitute the outputs 82,84 of the circuit 72.

In practice, the switching circuit 338, the accumulators 340,342, the subtraction circuit 344 and the comparators 346,348 actually form part of the A.T.E. 200, but they have been shown separately for the sake of clarity.

In the mode of operation selected by the setting of the aforementioned "high noise level" latch in the A.T.E. 200, the A.T.E. sets the circuit of FIG. 1 to its internal mode of operation by way of the input 38, inhibits the operation of the current source 14 and the current sink 16 by way of the input 36, and sets the switching circuit 338 to the state illustrated in FIG. 5. The timing circuit 34 produces a burst of trigger pulses at 1 kHz, and substantially simultaneously with each trigger pulse, renders the bridge switching circuit 310 conductive, by way of the input 74 of the circuit 72, during the time when the initial short, high-amplitude voltage excursion of each voltage pulse which would have been induced in the coil 44 by the corresponding test pulses (had the test pulses not been inhibited) would have occurred. Irrespective of their polarity, any noise pulses detected by the coil 44 of the probe 12/112 are transmitted by the switching circuit 310 to the filter capacitor 322, and the varying voltage level on this capacitor is integrated by the integrator 324. After a predetermined number of trigger pulses, the analogue-to-digital converter 334 is triggered by the frequency divider 336 to produce a digital signal representative of the voltage at the output of the integrator, whose time constant is chosen such that this voltage represents the average level of the voltage on the filter capacitor 322. The digital signal produced by the converter 334 is entered into the accumulator 340. This whole process is then repeated about one hundred times, so that the accumulator 340 finally contains a digital signal representative of the average value of the noise pulses detected by the coil 44 of the probe 12/112.

The A.T.E. 200 then removes the inhibit signal from the input 36, thus permitting operation of whichever one of the current source 14 and the current sink 16 has been selected by way of the inputs 26,28 of the circuit of FIG. 1, and sets the switching circuit 338 of FIG. 5 to its other (ie non-illustrated) state. The whole process described in the preceding paragraph is then repeated, only this time the pulses detected by the coil 44 of the probe 12/112 are due both to noise and to the current pulses being applied by way of the probe. At the end of this repetition, the accumulator 342 contains a digital signal representative of the average value of the test-pulse-induced and noise-induced pulses detected by the coil 44 of the probe 12/112.

The digital signal in the accumulator 340 is then subtracted from that in the accumulator 342, and the result is compared with the positive and negative thresholds applied to the comparators 346 and 348. If the result is more positive then the positive threshold, the comparator 346 produces an output signal, while if the result is more negative than the negative threshold, the comparator 348 produces an output signal. The output signals of the comparators 346,348 are used in the circuit of FIG. 1 in exactly the same manner as the output signals of the comparators 50,52 were used.

It will be appreciated that the average value of the noise pulses is likely to be fairly low, if not zero, whereas the average value of the test-pulse-induced pulses is likely to be significantly positive or significantly negative, depending on the polarity of the test pulses and the direction of the fault with respect to the point of application of the of the test pulses. Hence, in the mode of operation just described, the sense of the test-pulse-induced pulses detected by the detector 12/112 can be reliably determined even in the presence of noise pulses of the same order of magnitude as the test-pulse-induced pulses.

If desired, a further comparator (not shown) can be connected to the output of the accumulator 340 (ie the average noise pulse value accumulator), and arranged to produce a warning indication if the overall average noise pulse value exceeds a predetermined level. Additionally, the converter 334 can be asynchronously triggered by the A.T.E. 200, rather than synchronously triggered via the frequency divider 336, while the frequency of the trigger pulses produced by the timing circuit 34 in its internal mode of operation can be increased from the 1 kHz frequency mentioned earlier to several tens of kilohertz.

Many modifications can be made to the described embodiments of the invention. For example, the current probe 112 can if desired be separated from the rest of the apparatus of FIG. 3, ie current can be injected at one point in the conductor or node and its effects sensed at another point in the same conductor or node. Also, both of the indicators 156, 158, which typically comprise light-emitting diodes, may be on the same side of the housing 102 and associated with (or shaped like) arrows: one arrow points down, to indicate that the fault lies in the portion of the coductor or node on the side of the housing 102 carrying the indicators, while the other points up, to indicate that the fault lies in the portion of the conductor or node on the other side of the housing 102.

Moreover, the apparatus of FIGS. 1 and 3 can be adapted for use as a voltage probe as well as a current probe, in which case it can be arranged to stop applying a current pulse and/or to provide a warning if the logic state at the point of application of the current pulse starts to change in response to the current pulse; alternatively, the current source 14 and current sink 16 can be voltage-limited, so as to further ensure they cannot change the logic state of the circuit under test.

Further, the latch 228 of FIG. 4 can if desired be operator-settable, in response to information displayed by the A.T.E. 200, rather than (or as well as) being automatically settable by the A.T.E.

We claim:
1. A method of locating a fault in a powered electronic circuit, the method comprising:
 (a) setting said circuit to a state in which the fault is apparent;
 (b) locating the circuit node at which said fault originates;
 (c) repeatedly applying to a conductor of said circuit at said node pulses of current of the same predetermined sense, each pulse having an approximately triangular waveform with a relatively steep leading edge and a relatively less steep trailing edge;
 (d) sensing magnetic field changes induced adjacent to said conductor by the leading edge of each said pulse, so as to produce respective first signals representative of said pulse-induced changes;
 (e) integrating a predetermined number of said first signals to produce a signal representative of the average value thereof;
 (f) sensing magnetic field changes induced adjacent to said conductor, in the absence of said applied pulses, by noise currents in said circuit, so as to produce further signals representative of said noise, induced changes;
 (g) integrating a predetermined number of said further signals to produce a signal representative of the average value thereof; and
 (h) producing, in response to the magnitude and polarity of the difference between the respective average values of the first and second signals, a signal indicative of the direction of flow of said current pulses along said conductor, whereby to permit the determination of the direction of said fault relative to the point on said conductor at which said pulses are applied.

2. A method as claimed in claim 1, wherein steps (f) and (g) are effected before steps (c), (d) and (e).

3. A method as claimed in claim 1 or claim 2, further comprising the step of automatically effecting said determination of the direction of the fault in response to the predetermined sense of the current pulses and the direction of flow of the current pulses along the conductor.

4. A method as claimed in claim 1, wherein the magnitude of said current pulses is selected to be insufficient to alter the logical state of said circuit.

5. Apparatus for locating a fault in a powered electronic circuit, the apparatus comprising:
means arranged repetitively to apply to a conductor of said circuit pulses of current of predetermined sense and each having an approximately triangular waveform with a relatively steep leading edge and a relatively less steep trailing edge;
means arranged to sense magnetic field changes induced adjacent to said conductor by the leading edge of each said pulse and by noise currents in said circuit, so as to produce signals representative of said pulse-and noise-induced changes;
integrating means arranged to receive and integrate first and second pluralities of said change-representative signals to produce respective signals representative of the respective average values of said first and second pluralities of said change-representative signals, one of said first and second pluralities of signals being produced in response both to said pulses and to said noise, and the other being produced in response only to said noise; and
means responsive to the magnitude and polarity of the difference between the two average-representative signals to produce a signal indicative of the direction of flow of said current pulses along said conductor, whereby to permit the determination of the direction of said fault relative to the point on said conductor at which said pulses are applied.

6. Apparatus as claimed in claim 5, further comprising means responsive to the predetermined sense of the current pulses and to said flow direction indicative signal to determine and indicate the direction of the fault.

7. Apparatus as claimed in claim 5 or claim 6, wherein the current pulse applying means includes a differentiating circuit arranged to produce said triangular waveform at its output in response to a step signal at its input.

8. Apparatus as claimed in claim 5 or claim 6, wherein the sensing means comprises a coil wound upon a bifurcated core, and the current pulse applying means includes a conductive member disposed between the limbs of said core.

9. Apparatus as claimed in claim 5, wherein the magnitude of said current pulses is selected to be insufficient to alter the logical state of said circuit.

* * * * *